United States Patent
He

(10) Patent No.: US 11,057,063 B1
(45) Date of Patent: Jul. 6, 2021

(54) DUAL-BAND DIGITAL PRE-DISTORTION

(71) Applicant: NOKIA SOLUTIONS AND NETWORKS OY, Espoo (FI)

(72) Inventor: Tian He, Plano, TX (US)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 17/166,165

(22) Filed: Feb. 3, 2021

(30) Foreign Application Priority Data

Feb. 4, 2020 (FI) .................................. 20205117

(51) Int. Cl.
  *H04B 1/04* (2006.01)
  *H03F 1/32* (2006.01)
(52) U.S. Cl.
  CPC .......... *H04B 1/0475* (2013.01); *H03F 1/3241* (2013.01); *H04B 2001/0425* (2013.01)
(58) Field of Classification Search
  CPC .......... H03F 1/3247; H03F 2201/3233; H03F 2201/3224; H03F 1/3241; H04B 2001/0425; H04L 27/368; H04L 27/366
  See application file for complete search history.

(56) References Cited

U.S. PATENT DOCUMENTS

| | | | | |
|---|---|---|---|---|
| 2002/0190787 A1* | 12/2002 | Kim | .................. | H03F 1/3247 330/2 |
| 2012/0286865 A1* | 11/2012 | Chandrasekaran | ..... | H03F 3/195 330/149 |
| 2013/0249631 A1 | 9/2013 | Bai | | |
| 2015/0016567 A1* | 1/2015 | Chen | ................. | H03F 1/3282 375/297 |
| 2015/0043678 A1* | 2/2015 | Hammi | ............... | H03F 1/3258 375/297 |
| 2015/0381216 A1 | 12/2015 | Shor et al. | | |
| 2017/0338842 A1* | 11/2017 | Pratt | .................. | H03F 1/3247 |
| 2018/0262168 A1 | 9/2018 | Dzhigan et al. | | |
| 2018/0316367 A1* | 11/2018 | Johansson | ............. | H03F 1/32 |
| 2019/0140605 A1* | 5/2019 | Hong | ................. | H03F 1/3247 |

OTHER PUBLICATIONS

Milan Cabarkapa, Digital predistortion of RF amplifiers using baseband injection for mobile broadband communications, PhD thesis, University of Westminster, UK, 2014 (Year: 2014).*

(Continued)

*Primary Examiner* — Aristocratis Fotakis
(74) *Attorney, Agent, or Firm* — Squire Patton Boggs (US) LLP

(57) ABSTRACT

A model structure modeling a power amplifier is based on at least a binomial expansion, a first building block, a second building block, and a third building block. The first building block is a first complex sub-band signal with a first delay, the second building block is a multiplication of the first complex sub-band signal with a second delay and a complex conjugate of the first complex sub-band signal with a third delay, and the third building block is a multiplication of a second complex sub-band signal with a fourth delay and a complex conjugate of the second complex sub-band signal with a fifth delay. The sum of the first complex sub-band signal and the second complex sub-band signal is a baseband signal. Terms are obtained by optimizing delay combinations for the model structure. The model structure is used to dual-band digital pre-distortion of the baseband signal.

19 Claims, 2 Drawing Sheets

(56) References Cited

OTHER PUBLICATIONS

Jingmei Zhao, Linbo Zhai and Feng Yang, A Novel Multi-Band Reduced Sampling Rate and I/Q Compensation Technique for RF Power Amplifiers, Normal University, China, Dec. 23, 2019. (Year: 2019).*

A. Chahardah Cherik, E. Farshidi, A new Configurable Decimation Filter using Pascal's Triangle Theorem, World Academy of Science, Engineering and Technology International Journal of Electronics and Communication Engineering, vol. 5, No. 6, Shahid Chamran University of Ahvaz, Iran, 2011 (Year: 2011).*

Phuoc Si Nguyen, Infinite Impulse Response Digital Filters Design, Victoria University of Technology, Melbourne, Australia, International Journal of Signal Processing Systems vol. 5, No. 2, Jun. 2017 (Year: 2017).*

Finnish Search Report dated Jun. 9, 2020 corresponding to Finnish Patent Application No. 20205117.

M. Abdelaziz et al., "Decorrelation-Based Concurrent Digital Predistortion with a Single Feedback Path," In: IEEE Transactions on Microwave Theory and Techniques IEEE, Jun. 6, 2017, vol. 66, No. 1, pp. 280-293.

D. Zhou et al., "Novel Adaptive Nonlinear Predistorters Based on the Direct Learning Algorithm," In: IEEE Transactions on Signal Processing, IEEE, Oct. 19, 2006, vol. 55, No. 1, pp. 120-133.

Communication of Acceptance under section 29a of Patents Decree dated Jun. 9, 2020 corresponding to Finnish Patent Application No. 20205117.

\* cited by examiner

US 11,057,063 B1

DUAL-BAND DIGITAL PRE-DISTORTION

TECHNICAL FIELD

Various example embodiments relate to wireless communications and, particularly, to digital pre-distortion.

BACKGROUND

Wireless communication systems are under constant development. One example is signal bandwidth which is becoming wider and wider. That in turn creates challenges how to implement digital pre-distortion to mitigate distortion to transmitted signals, the distortion being caused by a power amplifier being driven into compression.

BRIEF DESCRIPTION

The scope of protection sought for various embodiments of the invention is set out by the independent claims. The embodiments, examples and features, if any, described in this specification that do not fall under the scope of the independent claims are to be interpreted as examples useful for understanding various embodiments of the invention.

An aspect provides a circuitry for dual-band digital pre-distortion of a baseband signal, the circuitry comprising at least means for performing: modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay, the third building block is a multiplication of a second complex sub-band signal with a fourth delay and a complex conjugate of the second complex sub-band signal with a fifth delay, the sum of the first complex sub-band signal and the second complex sub-band signal is the baseband signal, which is equal to the first complex sub-band signal with the first delay, and wherein terms for the model are obtained by optimizing delay combinations for the model structure; and using the model structure to the dual-band digital pre-distortion of the baseband signal. The solution increases model accuracy while providing more freedom to select the number of delays to be applied, thereby adapting the dual-band digital pre-distortion to wider and wider bandwidths.

In an embodiment, the circuitry further comprises means for performing: optimizing the delay combinations by using a subset of the model structure, the subset comprising a term containing the first building block and the second building block, a term containing the first building block and the third building block and a term containing all three building blocks; and applying the optimized delay combinations to the model structure to obtain delay values for terms in the model structure. The solution speeds up the optimization phase of the delay values.

In an embodiment, the circuitry further comprises means for performing: optimizing the delay combinations by using the model structure; and applying the optimized delay combinations to the model structure to obtain terms in the model structure.

In an embodiment, following formulas are used for the model structure:

$$x = x_1[n-d_0]$$

$$a = x_1[n-d_1]x^*_1[n-d_2]$$

$$b = x_2[n-d_3]x^*_2[n-d_4]$$

wherein
x=the baseband signal and the first building block
a=the second building block
b=the third building block
$x_1$=the first complex sub-band signal
$x^*_1$=the complex conjugate of the first complex sub-band signal
$x_2$=the complex second sub-band signal
$x^*_2$=the complex conjugate of second complex sub-band signal
$d_0$ to $d_4$=five delays.

In an embodiment, following formulas are used for the model structure $$x = x_1[n-d_0]$$

$$a = x_1[n-d_1]x^*_1[n-d_2]$$

$$b = x_2[n-d_3]x^*_2[n-d_4]$$

and the subset comprises following terms $$x_1[n-d_0]x_1[n-d_1]x^*_1[n-d_2]$$

$$x_1[n-d_0]x_2[n-d_3]x^*_2[n-d_4]$$

$$x_1[n-d_0] \cdot x_1[n-d_1]x^*_1[n-d_2]x_2[n-d_3]x^*_2[n-d_4]$$

wherein
x=the baseband signal and the first building block
a=the second building block
b=the third building block
$x_1$=the first complex sub-band signal
$x^*_1$=the complex conjugate of the first complex sub-band signal
$x_2$=the complex second sub-band signal
$x^*_2$=the complex conjugate of second complex sub-band signal
$d_0$ to $d_4$=five delays.

In an embodiment, the baseband signal used for the model structure is a baseband source signal, or a time aligned feedback signal, or a pre-distorted signal.

An aspect provides an apparatus comprising at least one processor; and at least one memory including computer program code, the at least one memory and computer program code configured to, with the at least one processor, cause the apparatus to perform: modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay, the third building block is a multiplication of a second complex sub-band signal with a fourth delay and a complex conjugate of the second complex sub-band signal with a fifth delay, the sum of the first complex sub-band signal and the second complex sub-band signal is a baseband signal, which is equal to the first complex sub-band signal with the first delay, and wherein terms for the model are obtained by optimizing delay combinations for the model structure; and using the model structure to dual-band digital pre-distortion of the baseband signal.

In an embodiment, the at least one memory and computer program code configured to, with the at least one processor, further cause the apparatus to perform: optimizing the delay combinations by using a subset of the model structure, the subset comprising a term containing the first building block and the second building block, a term containing the first building block and the third building block and a term containing all three building blocks; and applying the optimized delay combinations to the model structure to obtain delay values for terms in the model structure.

In an embodiment, the at least one memory and computer program code configured to, with the at least one processor, further cause the apparatus to perform: optimizing the delay combinations by using the model structure; and applying the optimized delay combinations to the model structure to obtain terms in the model structure.

In an embodiment, the apparatus is a transmitter.

In an embodiment, the apparatus is a base station.

An aspect provides a method for dual-band digital pre-distortion of a baseband signal, the method comprising: modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay, the third building block is a multiplication of a second complex sub-band signal with a fourth delay and a complex conjugate of the second complex sub-band signal with a fifth delay, the sum of the first complex sub-band signal and the second complex sub-band signal is the baseband signal, which is equal to the first complex sub-band signal with the first delay, and wherein terms for the model are obtained by optimizing delay combinations for the model structure; and using the model structure to the dual-band digital pre-distortion of the baseband signal.

In an embodiment, the method further comprises performing: optimizing the delay combinations by using a subset of the model structure, the subset comprising a term containing the first building block and the second building block, a term containing the first building block and the third building block and a term containing all three building blocks; and applying the optimized delay combinations to the model structure to obtain delay values for terms in the model structure.

An aspect provides a computer program product embodied on a computer-readable medium and comprising a computer program code readable by one or more circuitries, wherein the computer program code configures the one or more circuitries to carry out a computer process comprising: modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay, the third building block is a multiplication of a second complex sub-band signal with a fourth delay and a complex conjugate of the second complex sub-band signal with a fifth delay, the sum of the first complex sub-band signal and the second complex sub-band signal is a baseband signal, which is equal to the first complex sub-band signal with the first delay, and wherein terms for the model are obtained by optimizing delay combinations for the model structure; and using the model structure to dual-band digital pre-distortion of the baseband signal.

An aspect provides a computer program comprising instructions which, when the program is executed by one or more circuitries, cause the one or more circuitries to carry out: modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay, the third building block is a multiplication of a second complex sub-band signal with a fourth delay and a complex conjugate of the second complex sub-band signal with a fifth delay, the sum of the first complex sub-band signal and the second complex sub-band signal is a baseband signal, which is equal to the first complex sub-band signal with the first delay, and wherein terms for the model are obtained by optimizing delay combinations for the model structure; and using the model structure to dual-band digital pre-distortion of the baseband signal.

BRIEF DESCRIPTION OF DRAWINGS

Embodiments are described below, by way of example only, with reference to the accompanying drawings, in which.

DETAILED DESCRIPTION OF SOME EMBODIMENTS

The following embodiments are examples. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

Embodiments and examples described herein may be implemented in any communications system comprising wireless connection(s). In the following, different exemplifying embodiments will be described using, as an example of an access architecture to which the embodiments may be applied, a radio access architecture based on new radio (NR, 5G) or long term evolution advanced (LTE Advanced, LTE-A), without restricting the embodiments to such an architecture, however. It is obvious for a person skilled in the art that the embodiments may also be applied to other kinds of communications networks having suitable means by adjusting parameters and procedures appropriately. Some examples of other options for suitable systems are the universal mobile telecommunications system (UMTS) radio access network (UTRAN or E-UTRAN), long term evolution (LTE, the same as E-UTRA), beyond 5G, wireless local area network (WLAN or WiFi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

Figure 1:
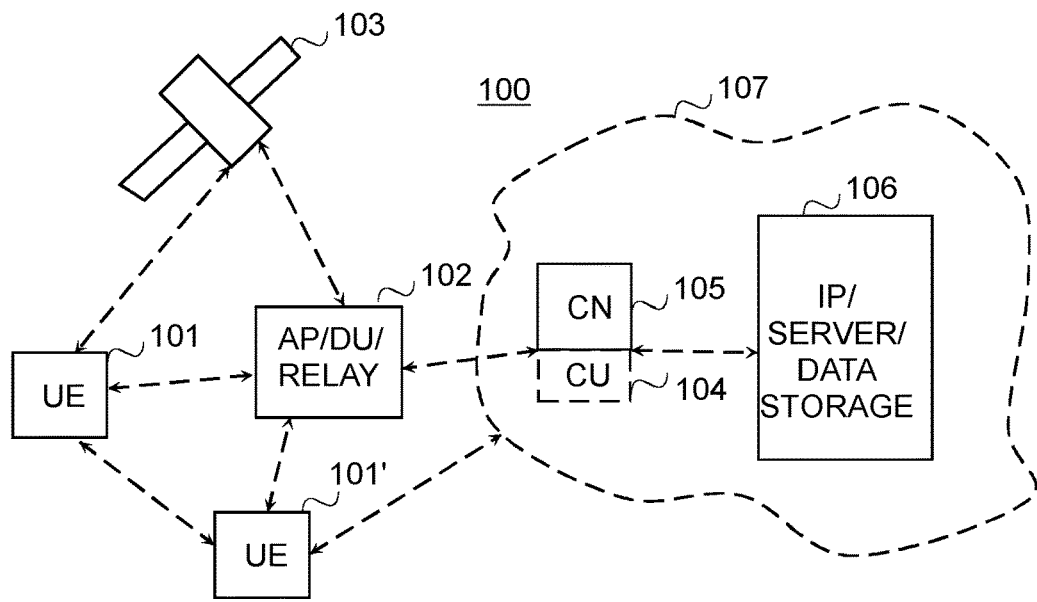
FIG. 1 illustrates an exemplified wireless communication system.

FIG. 1 depicts examples of simplified system architectures only showing some elements and functional entities, all being logical units, whose implementation may differ from what is shown. The connections shown in FIG. 1 are logical connections; the actual physical connections may be different. It is apparent to a person skilled in the art that the system typically comprises also other functions and structures than those shown in FIG. 1.

The embodiments are not, however, restricted to the system given as an example but a person skilled in the art may apply the solution to other communication systems provided with necessary properties.

The example of FIG. 1 shows a part of an exemplifying radio access network.

FIG. 1 shows user devices 101 and 101' configured to be in a wireless connection on one or more communication channels in a cell with an access node (such as (e/g)NodeB) 102 providing the cell. The physical link from a user device to a (e/g)NodeB is called uplink or reverse link and the physical link from the (e/g)NodeB to the user device is called downlink or forward link. It should be appreciated that (e/g)NodeBs or their functionalities may be implemented by using any node, host, server or access point (AP) etc. entity suitable for such a usage.

A communications system 100 typically comprises more than one (e/g)NodeB in which case the (e/g)NodeBs may also be configured to communicate with one another over links, wired or wireless, designed for the purpose. These links may be used for signalling purposes. The (e/g)NodeB is a computing device configured to control the radio resources of communication system it is coupled to. The NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to user devices. The antenna unit may comprise a plurality of antennas or antenna elements. The (e/g)NodeB is further connected to core network 105 (CN or next generation core NGC). Depending on the system, the counterpart on the CN side can be a serving gateway (S-GW, routing and forwarding user data packets), packet data network gateway (P-GW), for providing connectivity of user devices (UEs) to external packet data networks, or mobile management entity (MME), etc.

The user device (also called UE, user equipment, user terminal, terminal device, etc.) illustrates one type of an apparatus to which resources on the air interface are allocated and assigned, and thus any feature described herein with a user device may be implemented with a corresponding apparatus, such as a relay node. An example of such a relay node is a layer 3 relay (self-backhauling relay) towards the base station.

The user device typically refers to a portable computing device that includes wireless mobile communication devices operating with or without a subscriber identification module (SIM), including, but not limited to, the following types of wireless devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a user device may also be a nearly exclusive uplink only device, of which an example is a camera or video camera loading images or video clips to a network. A user device may also be a device having capability to operate in Internet of Things (IoT) network which is a scenario in which objects are provided with the ability to transfer data over a network without requiring human-to-human or human-to-computer interaction. The user device may also utilise cloud. In some applications, a user device may comprise a small portable device with radio parts (such as a watch, earphones or eyeglasses) and the computation is carried out in the cloud. The user device (or in some embodiments a relay node, such as a mobile termination (MT) part of the integrated access and backhaul (IAB) Node), is configured to perform one or more of user equipment functionalities. The user device may also be called a subscriber unit, mobile station, remote terminal, access terminal, user terminal or user equipment (UE) just to mention but a few names or apparatuses.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented.

5G enables using multiple input-multiple output (MIMO) antennas, many more base stations or nodes or corresponding network devices than the LTE (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications (such as (massive) machine-type communications (mMTC), including vehicular safety, different sensors and real-time control. 5G is expected to have multiple radio interfaces, namely below 6 GHz, cmWave and mmWave, and also being integradable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, below 6 GHz-cmWave-mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G require to bring the content close to the radio which leads to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks, such as a public switched telephone network or the Internet 106, or utilise services provided by them. The communication network may also be able to support the usage of cloud services, for example at least part of core network operations may be carried out as a cloud service (this is depicted in FIG. 1 by "cloud" 107). The communication system may also comprise a central control entity, or a like, providing facilities for networks of different operators to cooperate for example in spectrum sharing.

Edge cloud may be brought into radio access network (RAN) by utilizing network function virtualization (NVF) and software defined networking (SDN). Using edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at the RAN side (in a distributed unit, DU 102) and non-real time functions being carried out in a centralized manner (in a centralized unit, CU 104).

It should also be understood that the distribution of labour between core network operations and base station operations may differ from that of the LTE or even be non-existent. Some other technology advancements probably to be used are Big Data and all-IP, which may change the way networks are being constructed and managed. 5G (or new radio, NR) networks are being designed to support multiple hierarchies, where MEC servers can be placed between the core and the base station or nodeB (gNB). It should be appreciated that MEC can be applied in 4G networks as well.

5G may also utilize satellite communication to enhance or complement the coverage of 5G service, for example by providing backhauling. Possible use cases are providing service continuity for machine-to-machine (M2M) or Internet of Things (IoT) devices or for passengers on board of vehicles, or ensuring service availability for critical communications, and future railway/maritime/aeronautical communications. Satellite communication may utilise geostationary earth orbit (GEO) satellite systems, but also low earth orbit (LEO) satellite systems, in particular mega-constellations (systems in which hundreds of (nano)satellites are deployed). Each satellite 103 in the mega-constellation may cover several satellite-enabled network entities that create on-ground cells. The on-ground cells may be created through an on-ground relay node 102 or by a gNB located on-ground or in a satellite.

It is obvious for a person skilled in the art that the depicted system is only an example of a part of a radio access system and in practice, the system may comprise a plurality of (e/g)NodeBs, the user device may have an access to a plurality of radio cells and the system may comprise also other apparatuses, such as relay nodes, for example distributed unit (DU) parts of one or more IAB nodes, or other network elements, etc. At least one of the (e/g)NodeBs or may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. Typically, in multilayer networks, one access node provides one kind of a cell or cells, and thus a plurality of (e/g)NodeBs are required to provide such a network structure.

For fulfilling the need for improving the deployment and performance of communication systems, the concept of "plug-and-play" (e/g)NodeBs has been introduced. Typically, a networkwhich is able to use "plug-and-play" (e/g) Node Bs, includes, in addition to Home (e/g)NodeBs (H(e/g)nodeBs), a home node B gateway, or HNB-GW (not shown in FIG. 1). A HNB Gateway (HNB-GW), which is typically installed within an operator's network may aggregate traffic from a large number of HNBs back to a core network.

Figure 2:
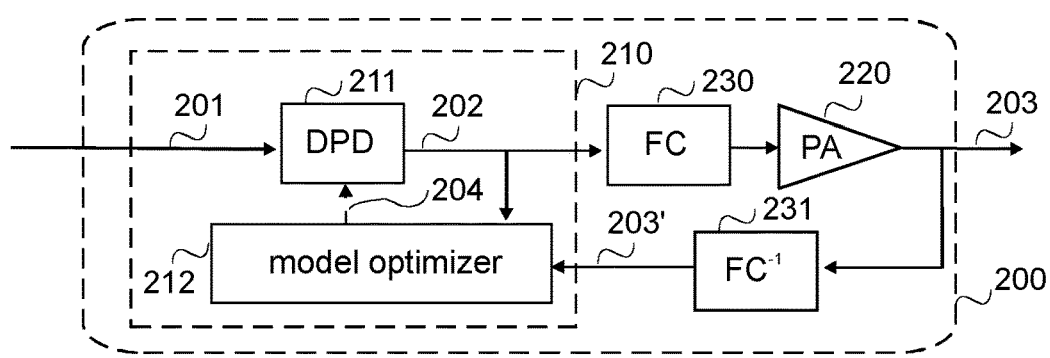
FIG. 2 is a schematic block diagram.

FIG. 2 illustrates in a very general level an architecture of a transmitter 200 configured to apply digital pre-distortion to mitigate distortions caused by a power amplifier being driven into compression to increase the efficiency of the power amplifier.

The transmitter 200 comprises at least one dual-band digital pre-distortion circuitry 210 (DPD), configured to receive a source signal 201, which is a multicarrier baseband signal z, splittable into a first complex sub-band signal $z_1$ and a second complex sub-band signal $z_2$, and to output a pre-distorted signal 202 to be forwarded via further components 230 (FC) to a power amplifier 220 to be amplified and send a modulated transmission signal 203 $y_t$ from the transmitter 200. The transmitter 200 is configured to provide the dual-band digital pre-distortion circuitry 210 with a time-aligned feedback signal 203' y by coupling the output $y_t$ of the power amplifier via a "counter further components" 231 ($FC^{-1}$) to the dual-band digital pre-distortion circuitry 210. Examples of the further components 230 include a modulator and an up-converter. Examples of the "counter further components" include a down-converter and a demodulator. It should be appreciated that the transmitter may comprise more than one dual-band digital pre-distortion circuitries, more than one power amplifier and also other components before and/or after the dual-band digital pre-distortion circuitry 210.

Figure 3:
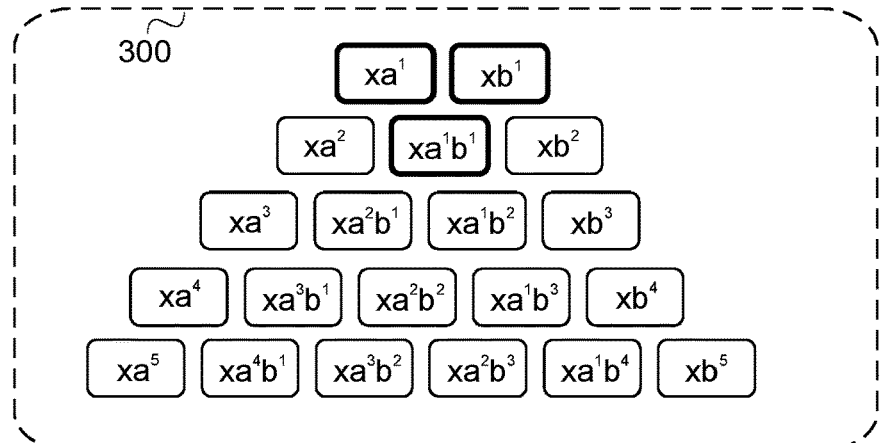
FIG. 3 illustrates an example of a model structure.

The dual-band digital pre-distortion circuitry 210 comprises a digital pre-distortion component DPD 211 configured to model the power amplifier, or its inverse, using optimized delay combinations of a signal x, and a model based on a model structure described in more detail with FIG. 3, and to generate pre-distorted signals based on the model and input 201. (A complete model comprises a model structure and a set of coefficients. The model structure may be pre-defined but the coefficients are determined from modulated transmission signals.) What is used as the signal x depends on whether the signal x is used in the digital pre-distortion component DPD 211 for pre-distortion signal generation or for model identification. For predistortion signal generation, the signal x is the source signal 201 regardless of the DPD architecture. For model identification, the signal x depends on DPD architecture used: the signal x is the source signal 201, when the DPD architecture is based on a direct learning algorithm (DLA); the signal x is the time-aligned feedback signal 203', when the DPD architecture is based on an indirect learning (ILA); and the signal x is the pre-distorted signal 202 when the DPD architecture is an iterative-inverse DPD (iiDPD).

In the illustrated example, to obtain the optimized delay combinations and to adapt the optimized delay combinations in the digital pre-distortion component DPD 211, the dual-band digital pre-distortion circuitry 210 comprises a model optimizer component 212, whose functionality will be described below with FIG. 4. When the DPD architecture is based on the direct learning algorithm (DLA), the model optimizer component 212 receives as inputs the multicarrier baseband source signal 201 as the signal x and the feedback baseband signal y 203' and outputs 204 optimized terms, i.e. delay combinations, to the digital pre-distortion component DPD 211. When the DPD architecture is based on the indirect learning (ILA), the model optimizer component 212 receives as inputs, the time-aligned feedback baseband signal y 203' and the pre-distorted signal 202 as the signal x and outputs 204 the optimized terms to the digital pre-distortion component DPD 211. In the same way, when the DPD architecture is an iterative-inverse DPD (iiDPD), the model optimizer component 212 receives as inputs the pre-distorted signal 202 as the signal x and the feedback baseband signal y 203' and outputs 204 optimized terms to the digital pre-distortion component DPD 211. (FIG. 2 illustrates examples for the indirect learning DPD architecture and for the iterative-inverse DPD architecture.)

In another example, the transmitter does not comprise the model optimizer component but the digital pre-distortion circuitry is comprises, as preconfigured settings, a plurality of model structures, wherein a model structure is for a specific signal configuration and comprises pre-configured delay values for terms, obtained by the same process that will be described below. In other words, for such a transmitter, the optimization is run by another apparatus and the result is then downloaded to the apparatus.

FIG. 3 illustrates an example of one layer of a model for terms for a dual-band model up to $11^{th}$ order in a fully expanded binomial expansion for a multicarrier baseband signal x split into two sub-band signals satisfying following formula:

$$x=x_1+x_2 \qquad (1)$$

wherein
x=multicarrier baseband signal (a baseband source signal or a time aligned feedback signal, or a pre-distorted signal, depending on DPD architecture used)
$x_1$=first complex sub-band signal
$x_1$=second complex sub-band signal.

As can be seen, the model form is based on Pascal's triangle. However, unlike in prior art, in which it is assumed that a term comprises both a factor x[n−d] and its complex conjugate x*[n−d], such an assumption is not made, but conjugate complex multiplications with different delays are used. Assuming that the freedom in identifying the best delay combinations is 5, following building blocks (2) can be used for the model illustrated in FIG. 3:

$$x=x_1[n-d_0]$$

$$a=x_1[n-d_1]x^*_1[n-d_2]$$

$$b=x_2[n-d_3]x^*_2[n-d_4]. \qquad (2)$$

wherein
$x_1$=first complex sub-band signal
$x^*_1$=complex conjugate of first complex sub-band signal
$x_2$=complex second sub-band signal
$x^*_2$=complex conjugate of second complex sub-band signal
$d_0$ to $d_4$=five delays
n=index of a sequence.

Using for the freedom in identifying the best delay combinations the value 5 results to a better model for a wide baseband width when compared to prior art solutions using value 1 or value 3.

It should be appreciated that for each specific combination of delays $d_0$ to $d_4$ the model comprises a layer. For example, if 10 different delay combinations are used, the model comprises ten triangles, above each other.

Further, it should be appreciated that the highest order of 11, used in FIG. 3, is only an example. The highest order can be decreased or increased, for example depending on transmitter power used in an apparatus. If the apparatus is a macro base station with a transmitter power between 40 W to 80 W per bandwidth, orders beyond 11 are most probably too weak to cause any problems, whereas for a base station with a transmitter power around 10 W the highest order of 9 may be used.

Figure 4:
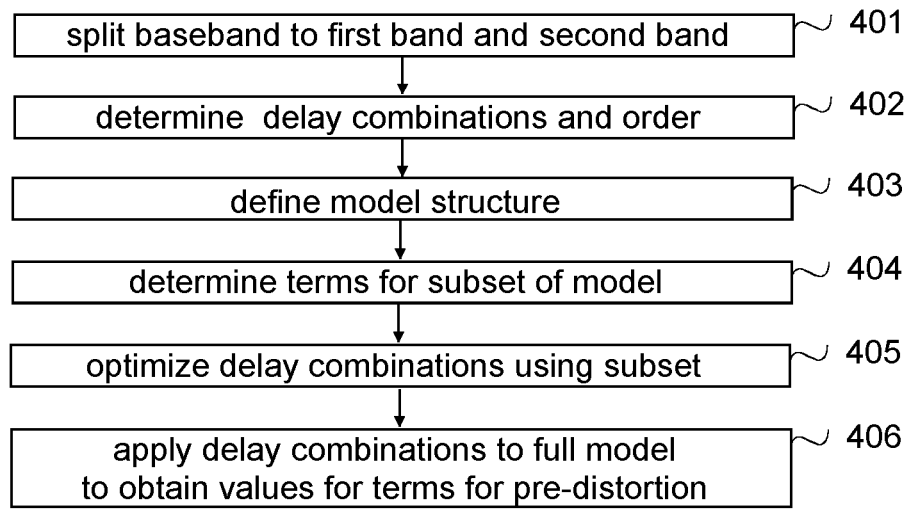
FIG. 4 illustrates an example functionality.

FIG. 4 illustrates a basic functionality how to create for a dual-band digital pre-distortion component a model modeling a power amplifier and how to determine the terms, when the five delays are used.

Referring to FIG. 4, a baseband is split in block 401 to a first sub-band and to a second sub-band according to the above formula (1). Then an integer indicating the number of delay combinations (i.e. the number of layers) and an integer indicating the highest order of the expansion are determined in block 402. The determining of the integer indicating the number of delay combinations may be using a preset integer, or receiving the integer via a user input, or the integer may be determined based on computational hardware resources of the circuitry. For example, assuming that each delay combination requires 20 complex multipliers, and the circuitry comprises 160 complex multipliers that can be used, then the maximum number of delay combinations is 8. The determining the integer indicating the highest order may be using a preset integer, or receiving the integer via a user input.

Then the model structure is defined in block 403, using the building blocks according to formula (2) above, through binomial expansion up to the determined highest order to define different terms for the model. The result of this block may be the model illustrated in FIG. 3, assuming the highest order of 11. In another example, when preset highest order is used, this block may comprise obtaining a preconfigured model structure of one layer from the memory.

Once the model structure has been defined, terms for a subset of the model are determined in block 404. The terms may be a preset terms forming the subset. The subset should contain a term comprising the first building block a (and not the second building block b), a term comprising the second building block b (and not the first building block a), and a term comprising both building blocks a and b. In other words, terms for each possible delay combinations are included. The subset can be used since if a specific delay combination is important for any other term than a term in the subset, its importance should also manifest in at least one of the terms in the subset, since they stem from the same underlying physics.

Using the example of FIG. 3, and degree of 5 delays, it suffices to determine in block 404 both terms of the $3^{rd}$ order, and the middle term of the $5^{th}$ order, having thicker surroundings in FIG. 3, the thicker surroundings indicating that they are preset terms of the subset. The terms are:

$3^{rd}$ order: $x_1[n-d_0]x_1[n-d_1]x^*_1[n-d_2]$ $3^{rd}$ order: $x_1[n-d_0]x_2[n-d_3]x^*_2[n-d_4]$ $5^{th}$ order: $x_1[n-d_0]\cdot x_1[n-d_1]x^*_1[n-d_2]x_2[n-d_3]x^*_2[n-d_4]$.

Then the delay combinations are optimized in block 406 using the subset. In other words, the optimization is performed to a model structure with drastically reduced complexity. For example, if 8 delay combinations are to be determined, the optimization is performed to an 8*5 matrix. (The model structure is a triangle with 8 layers, the unknown parameters in each layer being the 5 delays.) In the optimization, any generic optimization algorithm minimizing an objective function of following formula (3) may be used:

$$y=J(v) \quad (3)$$

wherein
y=the value to be minimized
J=cost function to be minimized
v=delay combinations to be determined.

Once the optimization in block 405 provides the delay combinations, they are applied in block 406 to the full model, to obtain delay values for the terms for the digital pre-distortion component via which the signal to be transmitted passes, and which performs the digital pre-distortion.

In another embodiment, in blocks 404 and 405 are performed to the whole model structure, resulting to optimizing the whole constructed model.

In a further embodiment, block 406 is replaced by further optimization resulting to a smaller model that is a subset of the full model (fully expanded binomial expansion), and the delay combinations are applied to the smaller model to obtain the delay values for the terms for pre-distortion. The further optimization to obtain the smaller model may use any generic optimization algorithm to find out, using the optimized delay combinations obtained at block 405, and to remove from the model, one or more terms the algorithm finds out as not important for a delay combinations. For example, assuming one of the delay combination obtained at block 405 is [0,1,0,−1,2], and the further optimization algorithm indicates that a term $xa^3b^2$ for this delay combination is not important, the term $xa^3b^2$ would be removed from the model.

As is known, usually the optimization algorithms are based on normalized mean square error calculations.

The above disclosed solutions increase model accuracy and those using the sub-set of model in optimization speed up the optimization phase, while providing more freedom to select the number of delays to be applied, thereby adapting the solution to wider and wider bandwidths. For example, LTE supports 1.4 MHz, 3 MHz, 5 MHz, 10 MHz, 15 MHz, and 20 MHz channel bandwidths, and the solution can be used with any combinations of them. More precisely, the solution can be used with two or more carriers spanning a wide frequency bandwidth. An example of two carriers spanning a wide frequency bandwidth includes one LTE-5 carrier located at 1807.5 MHz together with another LTE-5 carrier located at 2167.5 MHz, spanning a total bandwidth of 365 MHz, or 360 MHz apart from center to center.

Following examples support the advantages. In the examples, following bases were used:
   a vector signal generator, which is fed a two-carrier LTE-20 signal x that is 180 Mhz apart from carrier center to carrier center to a power amplifier (LTE-20 signal means an LTE signal/carrier having a channel bandwidth of 20 MHz (or roughly 20 MHz) and which can be configured to transmit at any frequency supported by the band in use), each carrier forming its own sub-band;
   the power amplifier was 40 W Gallium-Nitride power amplifier, driven to its rated power at 2 GHz;
   feedback signal was obtained by coupling and down-converting to the baseband the output signal from the power amplifier; and
   20 delay combinations were desired with the range of the delay being from −5 to 5.

In a first example the model and process described with FIGS. 3 and 4 was used with the bases. In the first example, the number of functions evaluations was 287 and the time taken by the optimization was 3.15 minutes. When the resulting delay combinations were applied to the full model, the received modeling accuracy expressed in normalized mean square error was −45.07 dB. The delay combinations obtained were following:
   [−4 −5 2 −3 −4]
   [−4 −4 −5 4 0]
   [−4 0 0 −3 −3]
   [−3 0 0 −4 4]
   [−3 2 4 0 −1]
   [−3 3 3 3 2]
   [−2 −3 −2 0 −5]
   [−1 −3 5 −4 2]
   [0 −3 1 4 −1]
   [0 0 0 0 0]
   [1 0 5 −4 −4]
   [1 5 −3 1 −3]
   [2 3 −1 −2 3]
   [2 5 −4 1 −3]
   [3 2 4 3 2]
   [3 2 5 −2 −1]
   [3 3 4 4 −5]
   [4 −2 −1 0 −4]
   [4 0 −2 −4 1]
   [5 −1 −1 4 −2]

In a second example, the embodiment in which no subset was used in the optimization was used with the bases. In the second example, the number of function evaluations was naturally the same 287, the time taken by the optimization was 61.80 minutes. When the resulting delay combinations were applied to the full model, the received modeling accuracy expressed in normalized mean square error was −45.19 dB. The delay combinations obtained were following:
   [−5 −4 0 −2 3]
   [−5 −2 −4 −2 −1]
   [−2 2 3 2 0]
   [−2 3 0 −4 3]
   [−1 −3 2 3 −5]
   [−1 4 0 4 3]
   [−1 5 1 −2 4]
   [0 −1 2 0 −3]

[0 0 0 0 0]
[0 5 5 4 0]
[1 −2 3 −5 2]
[1 1 2 0 0]
[1 1 4 5 1]
[2 3 2 2 3]
[3 −3 0 −1 −2]
[3 −3 5 3 2]
[3 4 −3 −3 4]
[4 −5 3 −1 −1]
[4 0 0 1 −2]
[4 4 3 1 4]

In a third example a prior art solution based on solution according to following formula (4) allowing three delays and using following basic building blocks (5) were used with the bases.

$$x_k[n-d_0]|x_1[n-d_1]|^{2l}|x_2[n-d_2]|^{2m}, k=1 \text{ or } 2 \quad (4)$$

wherein
$x_1$=first complex sub-band signal
$x_2$=second complex sub-band signal
$d_0$ to $d_2$=three delays
$l+m=N$, $N \in \{1,2,3,4,5\}$, $l \geq 0$, $m \geq 0$ $$x=x_k[n-d_0], k=1 \text{ or } 2$$

$$a=|x_1[n-d_1]|^2$$

$$b=|x_2[n-d_2]|^2. \quad (5)$$

In the third example, the number of function evaluations was 345, the time taken by the optimization was 3.65 minutes. When the resulting delay combinations were applied to the full model, the received modeling accuracy expressed in normalized mean square error was −42.02 dB. The delay combinations obtained in the prior art solution were following:
[−5 −1 −2]
[−4 4 −5]
[−3 −4 4]
[−3 3 1]
[−3 5 5]
[−2 −5 2]
[−2 −3 4]
[−2 −2 0]
[0 −3 −1]
[0 −1 −1]
[0 0 0]
[0 3 2]
[1 −3 −1]
[1 0 −3]
[1 3 5]
[1 5 4]
[2 5 −4]
[3 −2 −3]
[3 0 −4]
[5 3 0]

As the results of the examples teach, the model structure based on building blocks (2) doubles the modeling accuracy, by enabling improvement of about 3 dB compared to the prior art solution. Further, the use of the subset in optimizing requires less time than the prior art solution, and compared to the solution not using the subset, the accuracy is almost the same but optimization time is only 1/20 of the time required by the full optimization.

The blocks, and related functions described above by means of FIG. 4 are in no absolute chronological order, and some of them may be performed simultaneously or in an order differing from the given one. Other functions can also be executed between them or within them. Some of the blocks or part of the blocks or one or more pieces of information can also be left out or replaced by a corresponding block or part of the block or one or more pieces of information.

Figure 5:
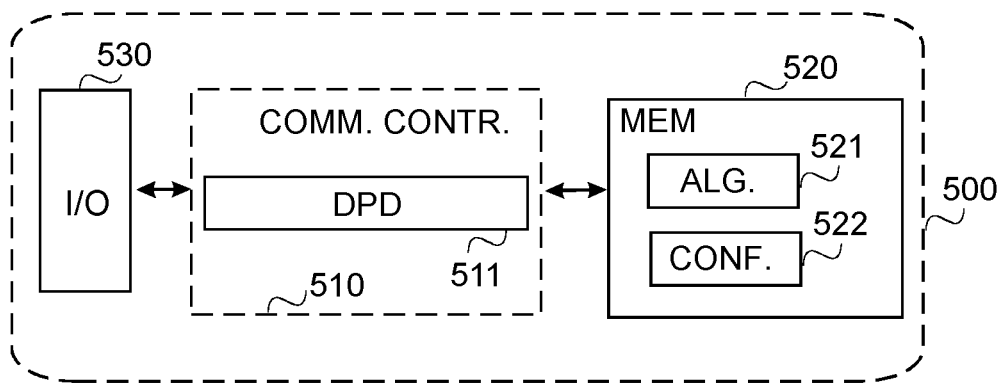
FIG. 5 is a schematic block diagram.

FIG. 5 illustrates an apparatus comprising a communication controller 510 such as at least one processor or processing circuitry, and at least one memory 520 including a computer program code (software, algorithm) ALG. 521, wherein the at least one memory and the computer program code (software, algorithm) are configured, with the at least one processor, to cause the respective apparatus to carry out any one of the embodiments, examples and implementations described above. FIG. 5 illustrates an apparatus comprising at least an DPD circuitry described above. The apparatus may be a DPD circuitry, an apparatus configured to generate models to be downloaded to DPD circuitries, or a transmitter, or an apparatus, such as a base station (or corresponding access node or interfacing device), comprising such a transmitter. The apparatus of FIG. 5 may be an electronic device.

Referring to FIG. 5, the memory 520 may be implemented using any suitable data storage technology, such as semiconductor based memory devices, flash memory, magnetic memory devices and systems, optical memory devices and systems, fixed memory and removable memory. The memory may comprise one or more algorithms ALG 521, such as an optimization algorithm and/or a configuration storage CONF. 521, such as a configuration database, for at least storing one or more configurations/preset delay values, including building blocks, and/or different delay values for terms for pre-distortion.

Referring to FIG. 5, the apparatus 500 may further comprise a communication interface 530 comprising hardware and/or software for realizing communication connectivity according to one or more radio communication protocols. The communication interface 530 may provide the apparatus with radio communication capabilities with one or more base stations (access nodes) of a wireless network and/or with one or more user terminals. The communication interface may comprise standard well-known analog radio components such as an amplifier, filter, frequency-converter and circuitries, conversion circuitries transforming signals between analog and digital domains, and one or more antennas. Digital signal processing regarding transmission and/or reception of signals may be performed in a communication controller 510. The communication controller 510 may comprise one or more dual-band digital pre-distorters (DPD) 511 configured to perform at least the predistortion using a model obtained according to any one of the embodiments/examples/implementations described above.

The apparatus 500 may further comprise an application processor (not illustrated in FIG. 5) executing one or more computer program applications that generate a need to transmit and/or receive data The application processor may execute computer programs forming the primary function of the apparatus.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

In an embodiment, at least some of the processes described in connection with FIGS. 2 to 4 may be carried out by an apparatus comprising corresponding means for carrying out at least some of the described processes. The apparatus may comprise separate means for separate phases of a process, or means may perform several phases or the whole process. Some example means for carrying out the processes may include at least one of the following: detector, processor (including dual-core and multiple-core processors), digital signal processor, controller, receiver, transmitter, encoder, decoder, memory, RAM, ROM, software, firmware, display, user interface, display circuitry, user interface circuitry, user interface software, display software, circuit, antenna, antenna circuitry, and circuitry. In an embodiment, the at least one processor, the memory, and the computer program code form processing means or comprises one or more computer program code portions for carrying out one or more operations according to any one of the embodiments/examples/implementations described herein.

According to yet another embodiment, the apparatus carrying out any of the embodiments comprises a circuitry including at least one processor and at least one memory including computer program code. When activated, the circuitry causes the apparatus to perform at least some of the functionalities according to any one of the embodiments/examples/implementations of FIGS. 2 to 4, or operations thereof.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, other electronic units designed to perform the functions described herein, or a combination thereof. For firmware or software, the implementation can be carried out through modules of at least one chip set (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via various means, as is known in the art. Additionally, the components of the systems (apparatuses) described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments/examples/implementations as described may also be carried out in the form of a computer process defined by a computer program or portions thereof. Embodiments of the methods described in connection with FIGS. 2 to 4 may be carried out by executing at least one portion of a computer program comprising corresponding instructions. The computer program may be in source code form, object code form, or in some intermediate form, and it may be stored in some sort of carrier, which may be any entity or device capable of carrying the program. For example, the computer program may be stored on a computer program distribution medium readable by a computer or a processor. The computer program medium may be, for example but not limited to, a record medium, computer memory, read-only memory, electrical carrier signal, telecommunications signal, and software distribution package, for example. The computer program medium may be a non-transitory medium, for example. Coding of software for carrying out the embodiments as shown and described is well within the scope of a person of ordinary skill in the art. In an embodiment, a computer-readable medium comprises said computer program.

Even though the invention has been described above with reference to examples according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A circuitry for dual-band digital pre-distortion of a baseband signal, the circuitry comprising hardware elements that are configured to perform:
    modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay and the third building block is a multiplication of a second complex sub-band signal with a fourth delay and a complex conjugate of the second complex sub-band signal with a fifth delay, wherein the sum of the first complex sub-band signal and the second complex sub-band signal is the baseband signal which is equal to the first complex sub-band signal with the first delay, and wherein terms for the model are obtained by optimizing delay combinations for the model structure; and
    using the model structure to the dual-band digital pre-distortion of the baseband signal.

2. The circuitry as claimed in claim 1, further comprising:
    optimizing the delay combinations by using a subset of the model structure, the subset comprising a term containing the first building block and the second building block, a term containing the first building block and the third building block and a term containing all three building blocks; and applying the optimized delay combinations to the model structure to obtain delay values for terms in the model structure.

3. The circuitry as claimed in claim 1, further comprising:
optimizing the delay combinations by using the model structure; and
applying the optimized delay combinations to the model structure to obtain terms in the model structure.

4. The circuitry as claimed in claim 1, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

wherein
x=the baseband signal and the first building block
a=the second building block
b=the third building block
$x_1$=the first complex sub-band signal
$x^*_1$=the complex conjugate of the first complex sub-band signal
$x_2$=the complex second sub-band signal
$x_{2*}$=the complex conjugate of second complex sub-band signal
$d_0$ to $d_4$=five delays.

5. The circuitry as claimed in claim 2, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

and the subset comprises following terms $$x_1[n-d_0]x_1[n-d_1]x^*_1[n-d_2]$$

$$x_1[n-d_0]x_2[n-d_3]x^*_2[n-d_4]$$

$$x_1[n-d_0]\cdot x_1[n-d_1]x^*_1[n-d_2]x_2[n-d_3]x^*_2[n-d_4]$$

wherein
x=the baseband signal and the first building block
a=the second building block
b=the third building block
$x_1$=the first complex sub-band signal
$x^*_1$=the complex conjugate of the first complex sub-band signal
$x_2$=the complex second sub-band signal
$x^*_2$=the complex conjugate of second complex sub-band signal
$d_0$ to $d_4$=five delays.

6. The circuitry as claimed in claim 1, wherein the baseband signal used for the model structure is a baseband source signal, or a time aligned feedback signal, or a pre-distorted signal.

7. An apparatus, comprising:
at least one processor; and
at least one memory including computer program code, the at least one memory and computer program code configured to, with the at least one processor, cause the apparatus to:
model a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay and the third building block is a multiplication of a second complex sub-band signal with a fourth delay and a complex conjugate of the second complex sub-band signal with a fifth delay, wherein the sum of the first complex sub-band signal and the second complex sub-band signal is a baseband signal which is equal to the first complex sub-band signal with the first delay, and wherein terms for the model are obtained by optimizing delay combinations for the model structure; and
use the model structure to dual-band digital pre-distortion of the baseband signal.

8. The apparatus as claimed in claim 7, wherein the at least one memory and computer program code configured to, with the at least one processor, further cause the apparatus to:
optimize the delay combinations by using a subset of the model structure, the subset comprising a term containing the first building block and the second building block, a term containing the first building block and the third building block and a term containing all three building blocks; and
apply the optimized delay combinations to the model structure to obtain delay values for terms in the model structure.

9. The apparatus as claimed in claim 7, wherein the at least one memory and computer program code configured to, with the at least one processor, further cause the apparatus to:
optimize the delay combinations by using the model structure; and
apply the optimized delay combinations to the model structure to obtain terms in the model structure.

10. The apparatus as claimed in claim 7, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

wherein
x=the baseband signal and the first building block
a=the second building block
b=the third building block
$x_1$=the first complex sub-band signal
$x^*_1$=the complex conjugate of the first complex sub-band signal
$x_2$=the complex second sub-band signal
$x^*_2$=the complex conjugate of second complex sub-band signal
$d_0$ to $d_4$=five delays.

11. The apparatus as claimed in claim 8, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

and the subset comprises following terms $$x_1[n-d_0]x_1[n-d_1]x^*_1[n-d_2]$$

$$x_1[n-d_0]x_2[n-d_3]x^*_2[n-d_4]$$

$$x_1[n-d_0]\cdot x_1[n-d_1]x^*_1[n-d_2]x_2[n-d_3]x^*_2[n-d_4]$$

wherein
x=the baseband signal and the first building block
a=the second building block
b=the third building block
  $x_1$=the first complex sub-band signal
  $x^*_1$=the complex conjugate of the first complex sub-band signal
  $x_2$=the complex second sub-band signal
  $x\&_2$=the complex conjugate of second complex sub-band signal
  $d_0$ to $d_4$=five delays.

12. The apparatus as claimed in claim 7, wherein the apparatus comprises a transmitter.

13. The apparatus as claimed in claim 7, wherein the apparatus comprises a base station.

14. A method for dual-band digital pre-distortion of a baseband signal, the method comprising:
  modeling a power amplifier by a model structure, which is based on at least a binomial expansion, a first building block, a second building block, and a third building block, wherein the first building block is a first complex sub-band signal with a first delay, the second building block is a multiplication of the first complex sub-band signal with a second delay and a complex conjugate of the first complex sub-band signal with a third delay and the third building block is a multiplication of a second complex sub-band signal with a fourth delay and a complex conjugate of the second complex sub-band signal with a fifth delay, wherein the sum of the first complex sub-band signal and the second complex sub-band signal is the baseband signal which is equal to the first complex sub-band signal with the first delay, and wherein terms for the model are obtained by optimizing delay combinations for the model structure; and
  using the model structure to the dual-band digital pre-distortion of the baseband signal.

15. The method as claimed in claim 14, further comprising performing:
  optimizing the delay combinations by using a subset of the model structure, the subset comprising a term containing the first building block and the second building block, a term containing the first building block and the third building block and a term containing all three building blocks; and
  applying the optimized delay combinations to the model structure to obtain delay values for terms in the model structure.

16. The method as claimed in claim 14, further comprising:
  optimizing the delay combinations by using the model structure; and applying the optimized delay combinations to the model structure to obtain terms in the model structure.

17. The method as claimed in claim 14, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

wherein
x=the baseband signal and the first building block
a=the second building block
b=the third building block
  $x_1$=the first complex sub-band signal
  $x^*_1$=the complex conjugate of the first complex sub-band signal
  $x_2$=the complex second sub-band signal
  $x^*_2$=the complex conjugate of second complex sub-band signal
  $d_0$ to $d_4$=five delays.

18. The method as claimed in claim 15, wherein following formulas are used for the model structure $$x=x_1[n-d_0]$$

$$a=x_1[n-d_1]x^*_1[n-d_2]$$

$$b=x_2[n-d_3]x^*_2[n-d_4]$$

and the subset comprises following terms $$x_1[n-d_0]x_1[n-d_1]x^*_1[n-d_2]$$

$$x_1[n-d_0]x_2[n-d_3]x^*_2[n-d_4]$$

$$x_1[n-d_0]\cdot x_1[n-d_1]x^*_1[n-d_2]x_2[n-d_3]x^*_2[n-d_4]$$

wherein
x=the baseband signal and the first building block
a=the second building block
b=the third building block
  $x_1$=the first complex sub-band signal
  $x^*_1$=the complex conjugate of the first complex sub-band signal
  $x_2$=the complex second sub-band signal
  $x^*_2$=the complex conjugate of second complex sub-band signal
  $d_0$ to $d_4$=five delays.

19. The method as claimed in claim 14, wherein the baseband signal used for the model structure is a baseband source signal, or a time aligned feedback signal, or a pre-distorted signal.

* * * * *